United States Patent
Albertini et al.

(10) Patent No.: US 10,727,754 B2
(45) Date of Patent: *Jul. 28, 2020

(54) ISOLATED PHASE SHIFTED DC TO DC CONVERTER WITH SECONDARY SIDE REGULATION AND SENSE COIL TO RECONSTRUCT PRIMARY PHASE

(71) Applicant: Texas Instruments Incorporated, Dallas, TX (US)

(72) Inventors: Pierluigi Albertini, Gropello Cairoli (IT); Maurizio Granato, Milan (IT); Giacomo Calabrese, Freising (DE); Roberto Giampiero Massolini, Pavia (IT); Joyce Marie Mullenix, San Jose, CA (US); Giovanni Frattini, Travaco' Siccomario (IT)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/367,691

(22) Filed: Mar. 28, 2019

(65) Prior Publication Data

US 2019/0229637 A1 Jul. 25, 2019

Related U.S. Application Data

(63) Continuation of application No. 15/712,330, filed on Sep. 22, 2017.

(51) Int. Cl.
*H02M 3/335* (2006.01)
*H03L 7/08* (2006.01)
*H02M 1/00* (2006.01)

(52) U.S. Cl.
CPC ... *H02M 3/33592* (2013.01); *H02M 3/33584* (2013.01); *H03L 7/0807* (2013.01); *H02M 2001/0003* (2013.01)

(58) Field of Classification Search
CPC ......... H02M 3/33592; H02M 3/33584; H02M 2001/0003; H03L 7/0807

(Continued)

(56) References Cited

U.S. PATENT DOCUMENTS 5,027,264 A 6/1991 DeDoncker et al.
5,355,294 A 10/1994 DeDoncker et al.
(Continued)

FOREIGN PATENT DOCUMENTS

| EP | 2757675 A2 | 7/2014 |
| JP | 6-251995 | 9/1994 |
| WO | 2017123241 | 7/2017 |

OTHER PUBLICATIONS

Received STIC search report from EIC 2800 searcher Samir Patel dated Jul. 15, 2019. (Year: 2019).*

(Continued)

*Primary Examiner* — Jue Zhang
*Assistant Examiner* — Htet Z Kyaw
(74) *Attorney, Agent, or Firm* — John R. Pessetto; Charles A. Brill; Frank D. Cimino

(57) ABSTRACT

Disclosed examples include isolated dual active bridge (DAB) DC to DC converters with first and second bridge circuits, a transformer with a sense coil, and a secondary side control circuit to provide secondary side switching control signals to regulate an output voltage or current signal by controlling a phase shift angle between switching transitions of the secondary side switching control signals and switching transitions of a secondary side clock signal, where the secondary side control circuit includes a clock recovery circuit to synchronize the secondary side clock signal to transitions in a sense coil voltage signal of the sense coil.

14 Claims, 3 Drawing Sheets

(58) Field of Classification Search
USPC .......................................................... 363/17
See application file for complete search history.

(56) References Cited

U.S. PATENT DOCUMENTS

| | | | |
|---|---|---|---|
| 5,414,609 | A | 5/1995 | Levran et al. |
| 5,457,624 | A | 10/1995 | Hastings |
| 5,590,032 | A | 12/1996 | Bowman et al. |
| 5,648,705 | A | 7/1997 | Sitar et al. |
| 6,147,393 | A | 11/2000 | Zommer |
| 6,324,084 | B1 | 11/2001 | Fujisawa |
| 6,441,598 | B1 | 8/2002 | Ivanov |
| 6,456,511 | B1 | 9/2002 | Wong |
| 6,567,285 | B2 | 5/2003 | Cho |
| 6,686,729 | B1 | 2/2004 | Kawamura et al. |
| 6,861,826 | B2 | 3/2005 | Lynch |
| 7,764,527 | B2 | 7/2010 | Takayanagi |
| 8,436,709 | B2 | 5/2013 | Fouquet et al. |
| 8,456,867 | B1 | 6/2013 | Karlsson et al. |
| 8,466,535 | B2 | 6/2013 | Hopper et al. |
| 8,674,418 | B2 | 3/2014 | Poddar et al. |
| 8,963,529 | B2 | 2/2015 | Cohen |
| 8,964,420 | B2 | 2/2015 | Zhang |
| 9,035,422 | B2 | 5/2015 | Khanolkar et al. |
| 9,673,721 | B2 * | 6/2017 | Trescases .......... H02M 3/33592 |
| 9,748,853 | B1 | 8/2017 | Li |
| 10,090,769 | B2 | 10/2018 | Baranwal et al. |
| 10,211,747 | B2 | 2/2019 | Agamy et al. |
| 2002/0141209 | A1 | 10/2002 | Bridge |
| 2004/0070378 | A1 | 4/2004 | Baldwin et al. |
| 2007/0058402 | A1 | 3/2007 | Shekhawat et al. |
| 2007/0121350 | A1 | 5/2007 | Duvnjak |
| 2007/0188288 | A1 | 8/2007 | Ishii |
| 2008/0212340 | A1 | 9/2008 | Tao et al. |
| 2008/0298106 | A1 | 12/2008 | Tateishi |
| 2009/0185397 | A1 | 7/2009 | Forghani-zadeh et al. |
| 2009/0196072 | A1 | 8/2009 | Ye |
| 2010/0027298 | A1 | 2/2010 | Cohen |
| 2010/0182803 | A1 | 7/2010 | Nan et al. |
| 2010/0315840 | A1 | 12/2010 | Cohen |
| 2011/0090725 | A1 | 4/2011 | Lu |
| 2011/0199799 | A1 | 8/2011 | Hui et al. |
| 2011/0205764 | A1 | 8/2011 | Sheng et al. |
| 2011/0249472 | A1 | 10/2011 | Jain et al. |
| 2012/0002377 | A1 | 1/2012 | French et al. |
| 2012/0081928 | A1 | 4/2012 | Roessler et al. |
| 2012/0099345 | A1 | 4/2012 | Zhao et al. |
| 2012/0275198 | A1 | 11/2012 | Cohen |
| 2013/0001735 | A1 | 1/2013 | Hopper et al. |
| 2013/0037908 | A1 | 2/2013 | Hopper et al. |
| 2013/0037909 | A1 | 2/2013 | French et al. |
| 2013/0077356 | A1 | 3/2013 | Cohen |
| 2013/0148385 | A1 | 6/2013 | Zhang |
| 2013/0272036 | A1 | 10/2013 | Fang |
| 2014/0003096 | A1 | 1/2014 | Deng |
| 2014/0078782 | A1 | 3/2014 | Rosado et al. |
| 2015/0092454 | A1 | 4/2015 | Cohen |
| 2015/0103563 | A1 | 4/2015 | Wang |
| 2015/0214846 | A1 | 7/2015 | Cohen |
| 2015/0365005 | A1 | 12/2015 | Panov et al. |
| 2016/0006356 | A1 | 1/2016 | Nirantare et al. |
| 2016/0020702 | A1 | 1/2016 | Tresaces et al. |
| 2016/0072312 | A1 | 3/2016 | Ichikawa |
| 2016/0094137 | A1 | 3/2016 | Jitaru et al. |
| 2016/0118904 | A1 | 4/2016 | Yoshikawa et al. |
| 2016/0149504 | A1 | 5/2016 | Quigley |
| 2016/0233779 | A1 | 8/2016 | Cohen |
| 2016/0268909 | A1 | 9/2016 | Liu et al. |
| 2016/0352237 | A1 | 12/2016 | Quigley |
| 2016/0365802 | A1 | 12/2016 | Freeman et al. |
| 2018/0041130 | A1 | 2/2018 | Kunz et al. |
| 2018/0340961 | A1 | 11/2018 | Adoni et al. |

OTHER PUBLICATIONS

Zhang et al., "A High Efficiency Flyback Converter with New Active Clamp Technique", IEEE Transactions on Power Electronics, vol. 25, No. 7, Jul. 2010, pp. 1775-1785.

STIC search report from EIC 2800 searcher Benjamin Martin, (13 pages).

Non-haloganated Low CTE BT Resin Laminate for IC Plastic Packages, MGC Mitsubishi Gas Chemical Company, Inc., available at www.jgc.co.jp/eng/products/lm/btprint/lineup/hfbt.html on Aug. 26, 2013 (pp. 1-5).

G200 BT/Epoxy Laminate and Prepreg, Isola Laminate Systems Corp., Data Sheet #5027/3/01, 1999, pp. 1-2.

LTM2881 Complete Isolated RS485/RS422 uModule Transceiver + Power, Linear Technology Corporation, LT0213 Rev F, 2009, pp. 1-24.

Krakauer, David, "Anatomy of a Digital Isolator", Analog Devices, Inc., Technical Article MS-2234, Oct. 2011, pp. 1-3.

Weinberg, et al; A New Zero Voltage and Zero Current Power-Switching Technique; IEEE; 1992; pp. 655-665.

* cited by examiner

ISOLATED PHASE SHIFTED DC TO DC CONVERTER WITH SECONDARY SIDE REGULATION AND SENSE COIL TO RECONSTRUCT PRIMARY PHASE

CROSS REFERENCE TO RELATED APPLICATION(S)

This continuation application claims priority to U.S. patent application Ser. No. 15/712,330, filed Sep. 22, 2017, which application is incorporated herein by reference in its entirety.

BACKGROUND

Isolated dual active bridge (DAB) converter circuits include first and second bridge circuits connected to primary and secondary sides of a transformer for DC to DC conversion. DAB converters can be used in unidirectional or bidirectional power conversion applications. The direction of power transfer is controlled by the leading or lagging phase relationship between switches of the first and second bridge circuits, where the bridge that is driven with a leading phase transmits power to the bridge operated with a lagging phase. Controlling the phase shift between the primary and secondary side bridge circuits allows control of the power flux and the amount of energy transferred through the isolation transformer. Isolated DAB converters provide low noise operation through linear control capabilities, along with the ability to implement zero voltage switching (ZVS) over a large phase shift range. These converters can also achieve lower RMS current levels for the same average output current compared to other types of soft switched DC to DC converters, e.g. resonant converters. However, the phase shift control mechanism requires operation of the primary and secondary bridge circuits according to shared clock information. Conventional isolated DAB converters use an isolated communication channel to share a clock between the primary and secondary sides, such as optical, capacitive or inductive circuits to transfer a clock signal from one side to the other. The shared clock can be used to implement closed-loop output voltage regulation by controlling the phase shift between the primary and secondary bridge switching signals. However, the additional isolated communication channel adds cost and complexity to the circuit designed and increases circuit area.

SUMMARY

Isolated dual active bridge (DAB) DC to DC converters are disclosed, including first and second bridge circuits, a transformer with a sense coil, and a secondary side control circuit. The control circuit implements secondary side regulation without an additional isolated communication channel. The control circuit provides secondary side switching control signals to regulate an output voltage or current signal by controlling a phase shift angle between switching transitions of the secondary side switching control signals and switching transitions of a secondary side clock signal. A clock recovery circuit recovers primary side phase information from the voltages and/or currents on the transformer coils or from voltages on the secondary side power stage, and synchronizes the secondary side clock signal to transitions in a transformer sense coil voltage signal.

An example isolated dual active bridge DC to DC converter includes a transformer with a primary winding, a secondary winding, and a sense coil. A first bridge circuit includes primary switches to provide a primary voltage signal to the primary winding. A second bridge circuit includes secondary switches coupled between the transformer secondary winding and an output, and the switches operate according to secondary side switching control signals to provide an output voltage or current signal at the second bridge circuit output. A control circuit provides the secondary side switching control signals to regulate the output voltage or current signal by controlling a phase shift angle between switching transitions of the secondary side switching control signals and switching transitions of a secondary side clock signal. The control circuit includes a clock recovery circuit configured to synchronize the secondary side clock signal to transitions in a sense coil voltage signal of the sense coil.

Disclosed examples include a control circuit to regulate an output of an isolated dual active bridge DC to DC converter. The control circuit includes a delay circuit that provides a delay clock signal delayed by a phase shift angle from switching transitions of a secondary side clock signal, a driver circuit that provides secondary side switching control signals with switching transitions corresponding to the transitions of the delay clock signal to operate second bridge circuit switches, a voltage control circuit that sets the phase shift angle according to the output and a setpoint, and a clock recovery circuit that synchronizes the secondary side clock signal to transitions in a sense coil voltage signal from a transformer sense coil.

Further disclosed examples provide a method of regulating an isolated dual active bridge DC to DC converter output, including operating secondary switches according to a secondary side clock signal to convert a transformer secondary voltage signal to regulate an output voltage or current signal by controlling a phase shift angle between switching transitions of secondary side switching control signals and switching transitions of the secondary side clock signal, as well as recovering a primary phase from a first rising edge of a transformer sense coil voltage signal, and synchronizing the secondary side clock signal to the primary phase.

DETAILED DESCRIPTION

Figure 1:
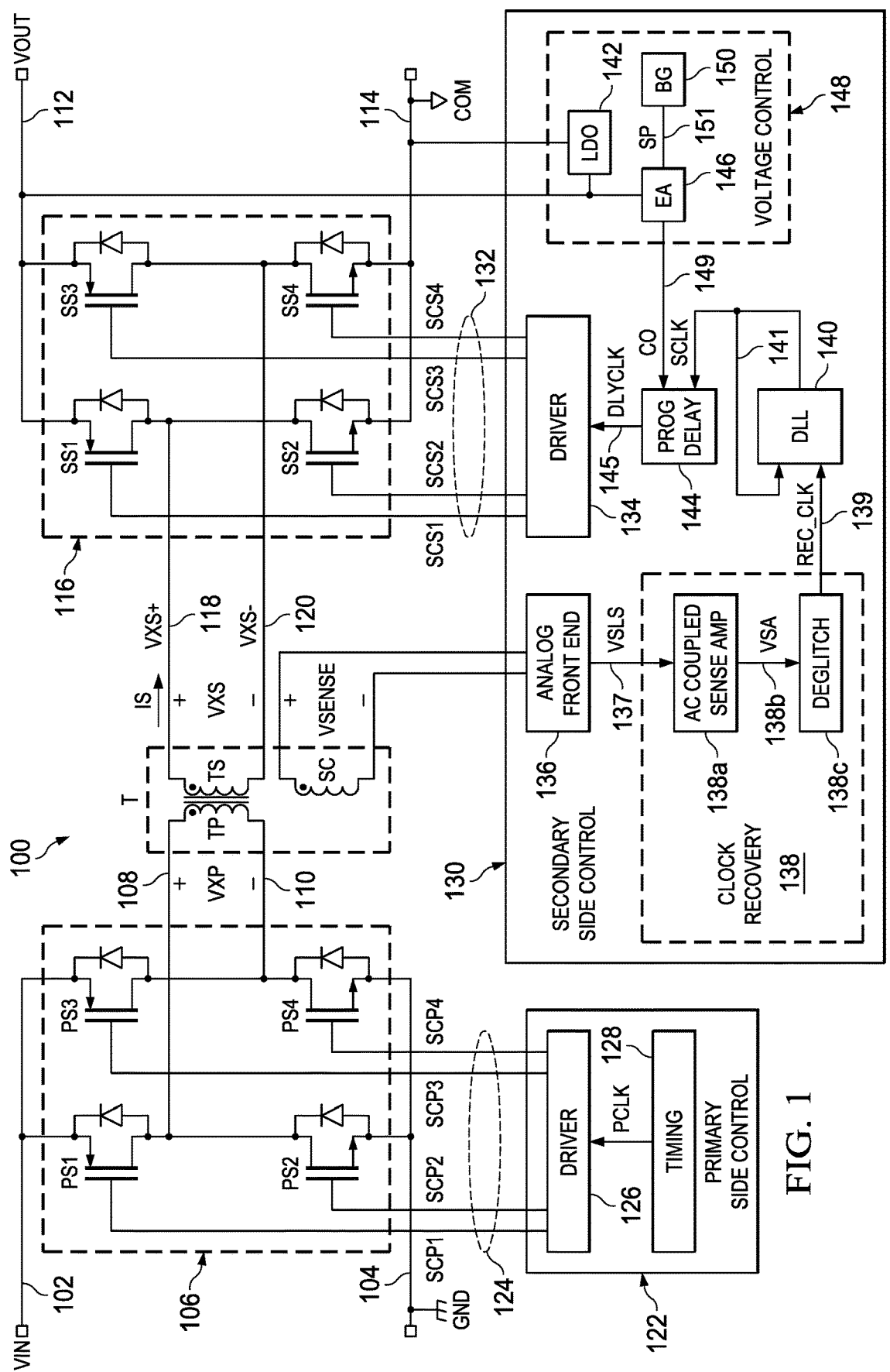
FIG. 1 is a schematic diagram of an isolated, phase shifted dual active bridge DC to DC converter.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "coupled" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows an isolated dual active bridge (DAB) DC to DC converter 100 that includes a transformer T with a primary winding TP, a secondary winding TS and a sense coil SC. A secondary side control circuit 130 implements phase shifted secondary side output voltage regulation without a separate communications channel for sharing clock information across an isolation barrier. The control circuit 130 in the illustrated example controls the output voltate. In other examples, the control circuit controls the output current, for example, using different sensing circuits. The converter 100 selectively recovers synchronization between the primary and secondary side switching operation by detecting transitions in a sense coil voltage signal VSENSE of the sense coil SC. The primary winding TP, the secondary winding TS and the sense coil SC are magnetically coupled via a shared core tructure (not shown) of the transformer T. The DC to DC converter 100 includes first and second bridge circuits 106, 116 respectively coupled with the primary and secondary windings TP, TS of the transformer T. In the illustrated example, the bridge circuits 106 and 116 are full bridge circuits that individually include four switching devices. In other examples, one or both of the first and second bridge circuits 106, 116 can be half bridge circuits with two switching devices.

The primary side circuitry receives an input voltage signal VIN at a first bridge circuit input including first and second input terminals or nodes 102 and 104. In one example, the input signal VIN is a DC voltage signal applied to the first input terminal 102 at a positive voltage relative to the voltage (e.g., GND) of the second input terminal 104. The first bridge circuit 106 includes primary switches PS1, PS2, PS3 and PS4 connected in a full bridge configuration. The primary switches PS1-PS4 are individually coupled between the first bridge circuit input 102, 104 and a first bridge circuit output with nodes or terminals 108 and 110 connected to the ends of the primary winding TP. The first bridge circuit output terminal 108 connects the drains of PS1 and PS2 to a first end of the primary winding TP, and the second bridge circuit output terminal 110 connects the drains of PS3 and PS4 to the second end of the primary winding TP. The illustrated example includes field effect transistor type switches PS1-PS4, where PS1 and PS3 are high side PMOS transistors and PS2 and PS4 are low side NMOS resistors. In other possible implementations, bipolar transistors, IGBTs, or other types and forms of switching devices can be used. Although illustrated as a full bridge, the first bridge circuit 106 can be implemented as a half bridge circuit in other examples.

The primary switches PS1, PS2, PS3 and PS4 are selectively opened and closed according to corresponding primary side switching control signals SCP1, SCP2, SCP3 and SCP4 from a primary side control circuit 122 to convert the input signal VIN to provide an alternating primary voltage signal VXP to the primary winding TP. The primary side circuitry in certain implementations may also include one or more additional inductors (not shown) in series with the primary winding TP. The first and second primary switches PS1 and PS2 provide a first circuit branch or leg circuit between the input terminals 102 and 104, and the switches PS3 and PS4 provide a second circuit branch between the terminals 102 and 104. The primary side control circuit 122 includes a primary side driver circuit 126 with outputs 124 that provide the primary side switching control signals SCP1-SCP4. The control circuit 122 also includes a primary side timing circuit 128 that provides a primary side clock signal PCLK to the driver circuit 126 to control timing of the primary side switching control signals SCP1-SCP4. Any suitable timing circuit 128 can be used to provide a primary side clock signal PCLK, such as an oscillator or a clock provided by an external pin. The driver circuitry 126 can include any suitable analog circuitry that selectively provides the signals SCP1-SCP4 at suitable levels to selectively actuate the corresponding switches PS1-PS4.

In the illustrated configuration using high side PMOS transistors PS1 and PS3 and NMOS low side transistors PS2 and PS4, a single switching control signal can be used for the transistors PS1 and PS2, and an inverse second control signal can be used for PS3 and PS4. For half bridge implementations, a single primary side switching control signal can be used to operate a high side PMOS transistor and a low side NMOS transistor. In one example, the control circuit 122 provides the switching control signals SCP1-SCP4 as 50% duty cycle waveforms to control the switches to alternately turn on PS1 and PS4 while turning off PS2 and PS3 in a first half cycle of a primary side clock signal, and to then turn on PS2 and PS3 while turning off PS1 and PS4 in a second primary clock half cycle. Other implementations are possible in which different duty cycles can be used and various pulse width modulation (PWM) schemes can be employed. When PS1 and PS4 are turned on and PS2 and PS3 are off, the first output terminal 108 is connected to the first input terminal 102, and the second output terminal 110 is connected to the second input 104. This applies a positive voltage signal VXP to the primary winding TP. When PS2 and PS3 are turned on, the first output terminal 108 is connected to the second input terminal 104, and the second output terminal 110 is connected to the first input terminal 102 to apply a negative voltage signal VXP to the primary winding TP. The alternating switching of PS1-PS4 delivers an AC primary voltage signal VXP to the primary winding TP of the transformer T via the first bridge circuit output 108, 110. The alternating primary voltage signal VXP creates an alternating secondary voltage signal VXS at a secondary winding TS of the transformer T.

The second bridge circuit 116 converts the secondary voltage signal VXS to provide an output voltage signal VOUT. In other examples, a current output signal is provided to the load. The second bridge circuit 116 includes an input with terminals 118 and 120 connected to the transformer secondary winding TS to receive the secondary voltage signal VXS. The second bridge circuit 116 also includes secondary switches SS1, SS2, SS3 and SS4 which are individually coupled between the second bridge circuit input 118, 120 and a second bridge circuit output having output terminals 112 and 114. The second bridge circuit 116 provides the output voltage signal VOUT at the first output terminal 112 as a positive voltage relative to a common or reference voltage (e.g., COM) at the second output terminal 114. The secondary voltage signal VXS across the second bridge circuit input terminals 118 and 120 establishes a voltage VXS+ at the first input terminal 118 and a voltage VXS− at the second input terminal 120.

A secondary side control circuit 130 provides secondary side switching control signals SCS1, SCS2, SCS3 and SCS4 to selectively open and closed the secondary switches SS1, SS2, SS3 and SS4 to provide a DC output voltage signal VOUT at the second bridge circuit output 112, 114. In the illustrated example, the second bridge circuit 116 is a full bridge circuit that includes four secondary switches SS1-SS4 individually coupled between the second bridge circuit input 118, 120 and the second bridge circuit output 112, 114. In another example, a half bridge configuration can be used. The second bridge circuit 116 in FIG. 1 includes high side PMOS transistors SS1 and SS3 and NMOS low side transistors SS2 and SS4. In the illustrated example, SS1 and SS2 form a first circuit branch or leg circuit between the output terminals 112 and 114. SS3 and SS4 provide a second circuit branch between the terminals 112 and 114. The individual secondary switches SS1-SS4 include body diodes as schematically shown in FIG. 1. In other possible implementations, bipolar transistors, IGBTs, or other types and forms of second bridge switching devices can be used.

The secondary side control circuit 130 includes one or more outputs 132 that provide the switching control signals SCS1-SCS4 to implement phase shifted control of the bridge circuit switches SS1-SS4 to convert the secondary voltage signal VXS and to provide the output voltage signal VOUT as a regulated DC voltage. The control circuit 130 implements a closed loop to regulate the output voltage signal VOUT by controlling a phase shift angle $\phi$ between switching transitions of the secondary side switching control signals SCS1-SCS4 and switching transitions of a secondary side clock signal SCLK from a clock circuit (e.g., DLL) 140. In one example, the control circuit 130 provides the secondary side switching control signals SCS1-SCS4 as 50% duty cycle waveforms to control the switches to alternately turn on SS1 and SS4 while turning off SS2 and SS3 in a first half cycle of the secondary side clock signal SCLK, and to then turn on SS2 and SS3 while turning off SS1 and SS4 in a second secondary clock half cycle. Different secondary side duty cycles and PWM techniques can be used in other implementations.

In the illustrated example with high side PMOS transistors SS1 and SS3 and NMOS low side transistors SS2 and SS4, a single switching control signal can be used for the transistors SS1 and SS2, and a second control signal can be used for SS3 and SS4. Similarly, for half bridge implementations, the control circuit 130 can provide a single control signal to operate a high side PMOS transistor and a low side NMOS transistor. When SS1 and SS4 are turned on and SS2 and SS3 are off, secondary winding current IS flows from the second output terminal 114 through SS4, and through the secondary winding TS to the first output terminal 112 through SS1. When SS2 and SS3 are turned on and SS1 and SS4 are off, the secondary winding current IS flows from the second output terminal 114 through SS2, the secondary winding TS, and then through SS3 to the first output terminal 112. In this manner, the secondary bridge circuit provides active rectification to deliver a DC output voltage signal VOUT.

Figure 2:
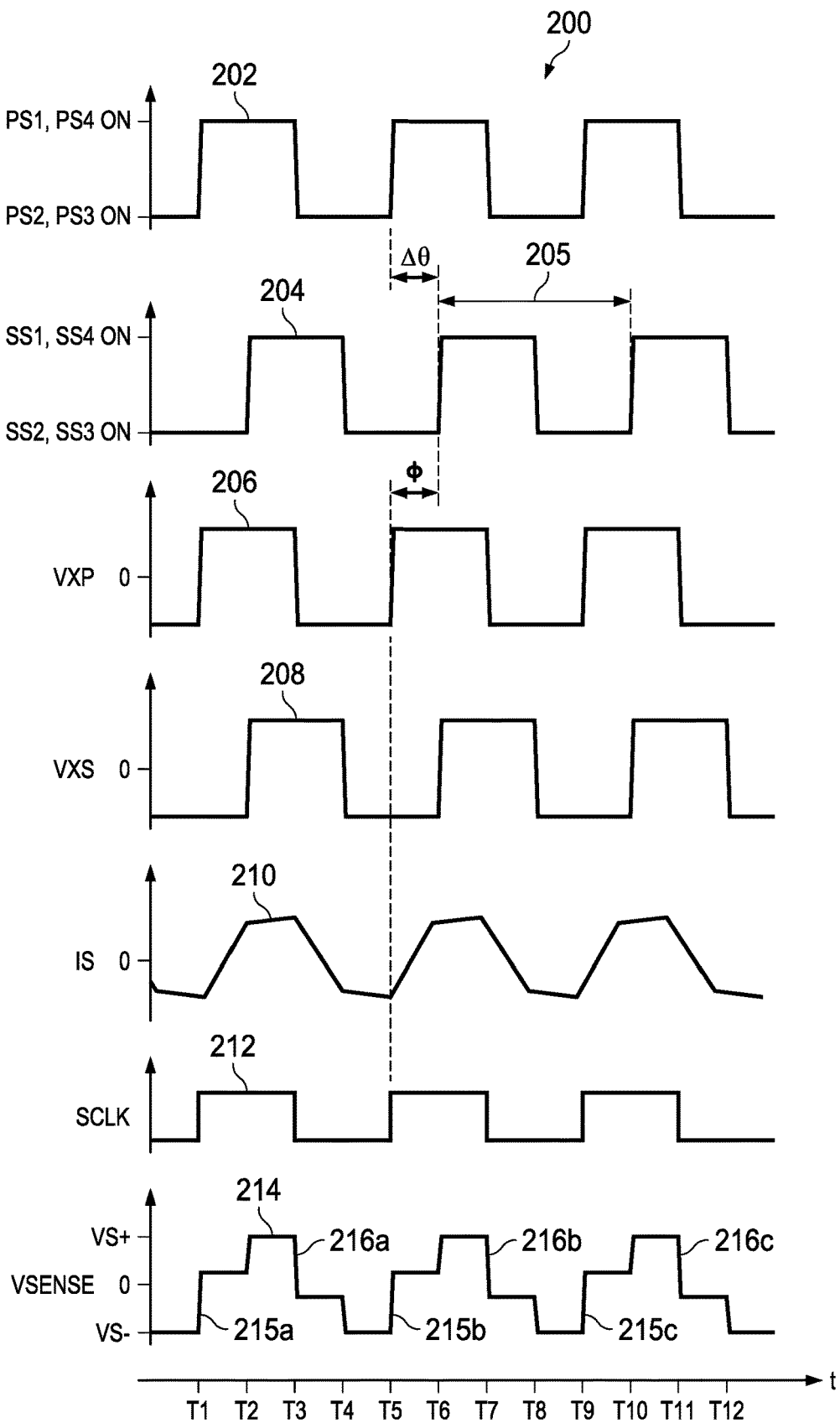
FIG. 2 is a signal diagram of signals in the DC to DC converter of FIG. 1.

FIG. 2 shows a signal diagram 200 that illustrates signals during operation of the DC to DC converter 100. A curve 202 illustrates steady-state operation of the primary side first bridge circuit 106 according to the control signals SCP1-SCP4 from the control circuit 122. This operation includes a first state (HIGH in FIG. 2) in which PS1 and PS4 are turned on and the other primary side switches PS2 and PS3 are turned off, as well as a second state (LOW in FIG. 2) in which PS2 and PS3 are turned on and the other primary side switches PS1 and PS4 are turned off. The primary side control circuit 122 provides the switching control signals represented by the switching control curve 202 according to the primary side clock signal PCLK. FIG. 2 also shows a secondary side switching logic curve 204 that represents the control signals SCS1-SCS4 from the secondary side control circuit 130 during steady-state operation. A curve 206 in FIG. 2 shows the primary voltage signal VXP, and a curve 208 shows the secondary voltage signal VXS resulting from the phase shifted operation of the first and second bridge circuits 106 AND 116. The secondary current IS is illustrated by a curve 210 in FIG. 2. A curve 212 shows the secondary side clock signal SCLK, and a curve 214 shows the sense voltage signal VSENSE of the transformer sense coil SC.

The second bridge circuit 116 converts the alternating secondary voltage signal VXS during steady-state conditions to provide a regulated DC output voltage signal VOUT at the second bridge circuit output 112, 114 to drive an attached load (not shown). The control circuit 130 controls the switching transitions of the secondary side switching control signals SCS1-SCS4 to lag the switching transitions of the secondary side clock signal SCLK by the phase shift angle $\phi$ in a range between −90 degrees and +90 degrees in each of a plurality of secondary side switching cycles 205. The curve 204 includes a first state (HIGH) representing SS1 and SS4 being turned on, and SS2, SS3 being turned off, as well as a second state (LOW) representing the situation where SS2, SS3 are on and SS1, SS4 are off. The secondary side control circuit 130 provides the switching control signals SCS1-SCS4 according to a feedback-adjusted delay relative to switching transitions of the secondary side clock signal SCLK. The adjustable delay sets the phase $\phi$. In normal operation, this provides a feedback-adjusted phase angle difference $\Delta\theta$ between the curves 202 and 204, where the rising edge transitions and falling edge transitions of the primary side curve 202 lead the transitions in the secondary side curve 204.

In operation, the secondary side control circuit 130 internally generates the secondary side clock signal SCLK and implements a variable delay closed loop to control the relative timing of the transitions in the secondary side switching control signals SCS1-SCS4 to selectively adjust the output voltage signal VOUT based on an internal or external setpoint signal. The secondary side control circuit 130 includes a driver circuit 134 with one or more outputs 132 that provide the secondary side switching control signals SCS1-SCS4 to the second bridge circuit 116. The control circuit 130 also includes an analog front end circuit 136 with an input coupled to the sense coil SC to receive the sense coil voltage signal VSENSE. The analog front end circuit in one example includes a level shifting circuit and filter circuitry to provide a level shifted voltage signal VSLS at an output 137 according to the sense coil voltage signal VSENSE. The analog front end circuit 136 provides level shifting to generate the signal VSLS at a suitable level for recovering clock signal information. In addition, the analog front end circuit 136 in certain examples includes low pass filtering circuitry, such as capacitors, to remove high-frequency components from the sense coil voltage signal VSENSE to deliver a filtered, level shifted voltage signal VSLS.

The converter 100 in certain examples may or may not include a dedicated isolated communication channel various data communication purposes. In the illustrated example, the converter 100 does not need a separate communication channel for synchronizing the primary and secondary clock signals PCLK and SCLK. The control circuit 130 includes a clock recovery circuit 138 that synchronizes the secondary side clock signal SCLK to transitions in the sense coil voltage signal VSENSE. The clock recovery circuit 138 includes an input connected to the output 137 of the analog front end circuit 136 to receive the level shifted voltage signal VSLS. The clock recovery circuit 138 includes an output 139 that provides a recovered clock signal REC_CLK to the clock circuit 140. The recovered clock signal REC_CLK includes transitions that correspond to transitions in the sense coil voltage signal VSENSE. In one example, the clock recovery circuit 138 includes a sense amplifier 138a with an input that is AC coupled to the output 137 of the analog front end circuit 136 to receive the level shifted voltage signal VSLS. A differential sense amplifier 138a is used in one example. The sense amplifier 138a includes an output 138b to provide a sense amp output voltage signal VSA. The clock recovery circuit 138 also includes a deglitch circuit 138c with an input connected to the output 138b of the sense amplifier 138a to receive the level shifted voltage signal VSLS. An output of the deglitch circuit 138c provides the recovered clock signal REC_CLK to the clock circuit 140. The recovered clock signal REC_CLK includes transitions that correspond to the transitions in the sense coil voltage signal VSENSE. As used herein, transitions in an alternating signal include rising and falling edges. The deglitch circuit 138c in one example includes a timer circuit (not shown) that prevents a pulse from occurring for a certain predetermined time after a transition has been detected. This makes the circuitry and sensitive to spurious edges on the coil signal within the predetermined time after the latest edge. The circuit 138c provides the recovered clock signal REC_CLK with discernible first rising and falling edges 215, 216 corresponding to the sensed conditions resulting from primary side switching of the first bridge circuit 106.

FIG. 2 shows an example sense coil voltage signal VSENSE waveform 214 that includes a first rising edge 215 in each secondary side switching control cycle 205. The sense coil voltage waveform 214 in this example includes a first rising edge at T1 illustrating the primary side switches PS1 and PS4 being turned on and PS2, PS3 being turned off while the secondary side switches SS1 and SS4 are off and SS2, SS3 are on. Before time T1, the first bridge circuit 106 applies a negative voltage V XP to the primary winding TP, and the secondary voltage VXS is also negative due to the switching states of the second bridge circuit 116. The sense coil voltage VSENSE in one example is the sum of the primary and secondary side voltage signals VXP (curve 206) and VXS (curve 208), scaled according to the turns ratios between the windings TP, TS and SC. Accordingly, preceding T1, the sense coil voltage curve 214 is at a maximal negative value VS−. When the primary bridge circuit 106 begins a new switching cycle by turning on PS1 and PS4 and turning off PS2 and PS3 at T1, the flux in the core of the transformer T creates the first rising edge 215a in the sense coil voltage waveform 214. The first rising edge 215a transitions from the maximum negative voltage level VS− toward zero volts. As seen in FIG. 2, therefore, the first rising edge 215a of the sense coil voltage waveform 214 represents a transition that corresponds to the rising edge of the primary side clock signal PCLK used to generate the primary side switching waveform curve 202.

At T2 in FIG. 2, the secondary side control signal switching transitions occur, with the curve 204 rising. This turns on a secondary side switches SS1 and SS4, and turns off SS2 and SS3. The sense coil voltage signal curve 214 undergoes a second rising edge in response to the switching at T2. The second rising edge in the curve 214 extends to a maximum positive voltage level VS+. At T3, the second half of the primary side switching cycle begins as the primary side control circuit 122 turns PS2, PS3 on and turns PS1, PS4 off (curve 202 falls). The switching creates a first falling edge 216a in the sense coil voltage signal waveform 214 that extends from the maximum positive voltage level VS+ toward zero volts. At T4, the second half of the secondary side switching cycle starts (curve 204 falls), as the secondary side control circuit 130 turns SS2, SS3 on and turns SS1, SS4 off. This causes a second falling edge in the curve 214 that extends to the maximum negative voltage level VS−. FIG. 2 shows a second example primary side switching cycle at T5, T6, T7 and T8, in which the sense coil voltage signal curve 214 includes a similar waveform with an initial or first rising edge 215b and a first falling edge 216b. A third example cycle is shown in FIG. 2 at T9, T10, T11 and T12, and the sense coil voltage curve 214 includes a similar waveform with a first rising edge 215c in a first falling edge 216c. FIG. 2 denotes an example secondary side switching cycle 205 that begins at T6 and ends at T10, where the primary side switching cycles lead the secondary side switching cycles 205 due to the phase-shifted operation of the primary and secondary side control circuits 122 and 130. In one example, the transformer T is constructed as an iso-laminate structure integrated with the sense coil SC formed in a metallization layer in between the primary and secondary windings TP and TS.

The clock recovery circuit 138 recovers the primary phase from the first rising edge 215 of the transformer sense coil voltage signal VSENSE, and the clock circuit 140 synchronizes the secondary side clock signal SCLK to the primary phase by aligning the transitions in the secondary side clock signal SCLK with transitions in the recovered clock signal REC_CLK from the clock recovery circuit 138. In the example of FIG. 1, the deglitch circuit 138c provides the recovered clock signal REC_CLK with a rising edge transition that corresponds to the first rising edge 215 and a falling edge transition that corresponds to the first falling edge 216 of the sense coil voltage signal VSENSE according to the level shifted voltage signal VSLS. In one example, the clock circuit 140 includes a delay locked loop (DLL) with first and second inputs and an output 141. The first input of the DLL circuit 140 is connected to the output 139 of the clock recovery circuit 138 to receive the recovered clock signal REC_CLK, and the second DLL input is connected to receive the secondary side clock signal SCLK as feedback. The DLL 140 operates in a continuous fashion to minimize the delay between transitions in the SCLK and REC_CLK signals and the output 141 provides the secondary side clock signal SCLK with transitions corresponding to transitions in the recovered clock signal REC_CLK. In this manner, the SCLK signal and the operation of the secondary side second bridge circuit 116 are synchronized to the primary side phase of the clock signal PCLK.

The secondary side control circuit 130 includes a delay circuit 144 (PROG DELAY in FIG. 1). The delay circuit 144 includes a first input to receive the secondary side clock signal SCLK from the DLL 140, as well as a second input to receive a control output signal CO to set a phase shift angle φ for regulating the output voltage signal VOUT. The delay circuit 144 includes an output 145 that provides a delay clock signal DLYCLK to the driver circuit 134. The driver circuit 134 generates the secondary side switching control signals SCS1-SCS4 at the outputs 132 having transitions that correspond to the transitions of the delay clock signal DLYCLK. The secondary side control circuit 130 also includes a voltage control circuit 148 with an output 149 coupled with the second input of the delay circuit 144 to provide the control output signal CO. The voltage control circuit 148 selectively adjusts the control output signal CO to set the phase shift angle φ used in closed-loop regulation according to the output voltage signal VOUT and a setpoint signal SP. The delay clock signal DLYCLK includes transitions delayed by the phase shift angle φ from the switching transitions of the secondary side clock signal SCLK. This operation ensures that the secondary side control circuit 130 operates the switches of the second bridge circuit 116 in phase shifted manner relative to transitions of the secondary side clock signal SCLK.

The voltage control circuit 148 in one example includes an error amplifier circuit 146 and a bandgap reference circuit 150 with an output 151 that provides a setpoint signal SP for regulating the output voltage VOUT. In one example, the output voltage signal VOUT is provided as an input to a low dropout (LDO) regulator circuit 142 that drives a connected load (not shown). As the voltage control circuit 148 provides closed-loop regulation of the output voltage signal VOUT, the LDO regulator circuit 142 can be omitted in other implementations. The error amplifier 146 senses the output voltage signal VOUT at the node 112 and compares the output voltage to the setpoint signal SP from the bandgap reference circuit 150, and generates the control output signal CO at the voltage control circuit output 149. The programmable delay circuit 144 selectively adjusts the delay clock signal DLYCLK used by the driver 134 to set the phase angle of the switching control signals provided at the outputs 132 to the switches of the second bridge circuit 116. In this manner, closed loop voltage regulation is achieved to regulate the output voltage signal VOUT according to the setpoint signal SP. As previously mentioned, the relative phase angle Δθ between the primary and secondary side switching control signals (FIG. 2 above) controls the amount of energy transfer from the primary side first bridge circuit 106 to the second bridge circuit 116, and thus controlled phase shifted operation of the bridge circuits 106, 116 provides control over the output voltage signal level VOUT. The disclosed phase shifted dual active bridge DC to DC converter circuit 100, moreover, achieves this control capability without a dedicated communication channel for transferring clock information between the primary and secondary circuits.

Figure 3:
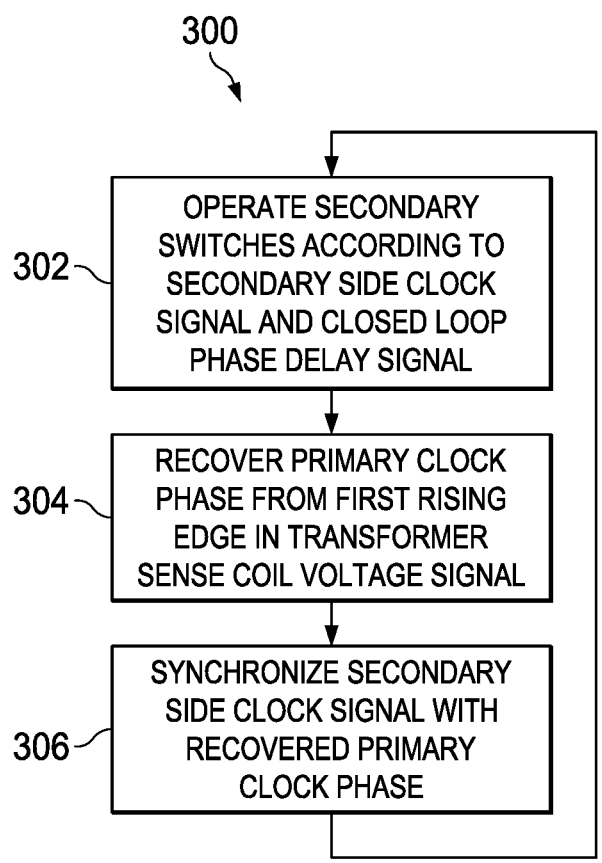
FIG. 3 is a flow diagram of a method for regulating an output signal in a dual active bridge DC to DC converter.

FIG. 3 shows a method 300 for regulating an output signal (e.g., VOUT) in a dual active bridge DC to DC converter (e.g., converter 100 described above). The method 300 begins at 302, where secondary switches are operated according to a secondary side clock signal (e.g., SCLK) and a closed loop phase delay signal (e.g., ϕ to provide the output voltage signal VOUT. In one example, operating the secondary side switches of the second bridge circuit 116 at 302 converts the transformer secondary voltage signal VXS to regulate the output voltage signal VOUT by controlling the phase shift angle ϕ between switching transitions of the secondary side switching control signals SCS1-SCS4 and switching transitions of the secondary side clock signal SCLK. In certain implementations, the operations at 302 further include providing a control output signal CO to set the phase shift angle ϕ according to the output voltage signal VOUT and a setpoint signal SP, as well as providing a delay clock signal DLYCLK that includes transitions delayed by the phase shift angle ϕ from the switching transitions of the secondary side clock signal SCLK, and providing the secondary side switching control signals SCS1-SCS4 including switching transitions that correspond to the transitions of the delay clock signal DLYCLK. At 304, a primary clock phase is recovered from a first rising edge 215 or a first falling edge 216 of a transformer sense coil voltage signal VSENSE. At 306, the secondary side clock signal SCLK is synchronized to the primary phase recovered from the sense coil voltage signal.

Disclosed examples include isolated dual active bridge DAB converters 100 with secondary side output voltage regulation using phase shift switching control with primary to secondary side clock information synchronization without separate communication channels and associated isolation circuitry, using a clock recovery circuit 138 to synchronize the secondary side clock signal SCLK to transitions in a sense coil voltage signal VSENSE of the sense coil SC. This advantageously saves cost, complexity, and circuit size compared to prior solutions using isolated communication channels to transfer clock information, while allowing secondary side regulation with the primary side clock information being recovered through sense coil signaling.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An isolated dual active bridge DC to DC converter, comprising:

a transformer, including a primary winding, a secondary winding, and a sense coil;

a first bridge circuit, including a first bridge circuit input to receive an input signal, a first bridge circuit output coupled with the primary winding, and a plurality of primary switches individually coupled between the first bridge circuit input and the first bridge circuit output, the primary switches operative according to primary side switching control signals to provide a primary voltage signal to the first bridge circuit output;

a second bridge circuit, including a second bridge circuit input coupled to receive a secondary voltage signal from the secondary winding, a second bridge circuit output, and a plurality of secondary switches individually coupled between the second bridge circuit input and the second bridge circuit output, the secondary switches operative according to secondary side switching control signals to provide an output voltage or current signal at the second bridge circuit output;

a primary side control circuit configured to provide the primary side switching control signals according to a primary side clock signal; and a secondary side control circuit including a clock recovery circuit, a delay locked loop (DLL) circuit and an analog front end circuit, the analog front end circuit including an input coupled to the sense coil to receive a sense coil voltage signal, a level shifting circuit, a filter circuit, and an output to provide a level shifted voltage signal according to the sense coil voltage signal, and the secondary side control circuit being configured to provide the secondary side switching control signals to regulate the output voltage or current signal by controlling a phase shift angle between switching transitions of the secondary side switching control signals and switching transitions of a secondary side clock signal;

the clock recovery circuit including an input connected to the output of the analog front end circuit to receive the level shifted voltage signal, and an output to provide a recovered clock signal including transitions corresponding to the transitions in the sense coil voltage signal, and the clock recovery circuit being configured to synchronize the secondary side clock signal to transitions in the sense coil voltage signal of the sense coil; and the delay locked loop (DLL) circuit including: a first input connected to the output of the clock recovery circuit to receive the recovered clock signal; a second input connected to receive the secondary side clock signal; and a DLL output to provide the secondary side clock signal having transitions corresponding to transitions in the recovered clock signal.

2. The DC to DC converter of claim 1, wherein the clock recovery circuit includes:
   a sense amplifier, including an input that is AC coupled to the output of the analog front end circuit to receive the level shifted voltage signal, and an output to provide a sense amp output voltage signal; and
   a deglitch circuit, including an input connected to the output of the sense amplifier to receive the level shifted voltage signal, and an output to provide the recovered clock signal with a transition corresponding to a first rising or falling edge of the sense coil voltage signal according to the level shifted voltage signal.

3. The DC to DC converter of claim 2, wherein the secondary side control circuit controls the switching transitions of the secondary side switching control signals to lag the switching transitions of a secondary side clock signal by the phase shift angle in a range between −90 degrees and +90 degrees in each of a plurality of secondary side switching cycles.

4. The DC to DC converter of claim 3,
   wherein the sense coil voltage signal has a waveform including the first rising edge transitioning from a maximum negative voltage level toward zero volts, a second rising edge extending to a maximum positive voltage level, a first falling edge extending from the maximum positive voltage level toward zero volts, and a second falling edge extending to the maximum negative voltage level; and
   wherein the deglitch circuit provides the recovered clock signal with a rising edge transition corresponding to the first rising edge of the sense coil voltage signal according to the level shifted voltage signal.

5. The DC to DC converter of claim 3,
   wherein the first bridge circuit is a full bridge circuit, including four primary switches individually coupled between the first bridge circuit input and the first bridge circuit output; and
   wherein the second bridge circuit is a full bridge circuit, including four secondary switches individually coupled between the second bridge circuit input and the second bridge circuit output.

6. The DC to DC converter of claim 3, wherein the secondary side control circuit includes:
   a delay circuit, including a first input to receive the secondary side clock signal, a second input to receive a control output signal to set the phase shift angle, and an output to provide a delay clock signal including transitions delayed by the phase shift angle from the switching transitions of the secondary side clock signal;
   a secondary side driver circuit, including an input coupled with the output of the delay circuit to receive the delay clock signal, and a plurality of outputs to provide the secondary side switching control signals having switching transitions corresponding to the transitions of the delay clock signal; and
   an output control circuit, including an output coupled with the second input of the delay circuit to provide the control output signal to set the phase shift angle according to the output voltage or current signal and a setpoint signal.

7. The DC to DC converter of claim 2, wherein the secondary side control circuit includes:
   a delay circuit, including a first input to receive the secondary side clock signal, a second input to receive a control output signal to set the phase shift angle, and an output to provide a delay clock signal including transitions delayed by the phase shift angle from the switching transitions of the secondary side clock signal;
   a secondary side driver circuit, including an input coupled with the output of the delay circuit to receive the delay clock signal, and a plurality of outputs to provide the secondary side switching control signals having switching transitions corresponding to the transitions of the delay clock signal; and
   an output control circuit, including an output coupled with the second input of the delay circuit to provide the control output signal to set the phase shift angle according to the output voltage or current signal and a setpoint signal.

8. The DC to DC converter of claim 1, wherein the primary side control circuit includes:
   a primary side driver circuit, including a plurality of outputs to provide the primary side switching control signals; and
   a primary side timing circuit to provide the primary side clock signal to the primary side driver circuit to control timing of the primary side switching control signals.

9. An isolated dual active bridge DC to DC converter, comprising:
   a transformer, including a primary winding, a secondary winding, and a sense coil;
   a first bridge circuit, including a first bridge circuit input to receive an input signal, a first bridge circuit output coupled with the primary winding, and a plurality of primary switches individually coupled between the first bridge circuit input and the first bridge circuit output, the primary switches operative according to primary side switching control signals to provide a primary voltage signal to the first bridge circuit output;
   a second bridge circuit, including a second bridge circuit input coupled to receive a secondary voltage signal from the secondary winding, a second bridge circuit output, and a plurality of secondary switches individually coupled between the second bridge circuit input and the second bridge circuit output, the secondary switches operative according to secondary side switching control signals to provide an output voltage or current signal at the second bridge circuit output;
   a primary side control circuit configured to provide the primary side switching control signals according to a primary side clock signal; and
   a secondary side control circuit configured to: provide the secondary side switching control signals to regulate the output voltage or current signal by controlling a phase shift angle between switching transitions of the secondary side switching control signals and switching transitions of a secondary side clock signal; and control the switching transitions of the secondary side switching control signals to lag the switching transitions of the secondary side clock signal by the phase shift angle in a range between −90 degrees and +90 degrees in each of a plurality of secondary side switching cycles;
   a sense coil voltage signal of the sense coil having a waveform including a first rising edge transitioning from a maximum negative voltage level toward zero volts, a second rising edge extending to a maximum positive voltage level, a first falling edge extending from the maximum positive voltage level toward zero volts, and a second falling edge extending to the maximum negative voltage level; and the secondary side control circuit including a clock recovery circuit configured to synchronize the secondary side clock signal to: transitions in the sense coil voltage signal; and the first rising edge of the sense coil voltage signal according to the level shifted voltage signal.

10. The DC to DC converter of claim 9, wherein the first bridge circuit is a full bridge circuit, including four primary switches individually coupled between the first bridge circuit input and the first bridge circuit output; and wherein the second bridge circuit is a full bridge circuit, including four secondary switches individually coupled between the second bridge circuit input and the second bridge circuit output.

11. The DC to DC converter of claim 9, wherein the secondary side control circuit includes:

a delay circuit, including a first input to receive the secondary side clock signal, a second input to receive a control output signal to set the phase shift angle, and an output to provide a delay clock signal including transitions delayed by the phase shift angle from the switching transitions of the secondary side clock signal;

a secondary side driver circuit, including an input coupled with the output of the delay circuit to receive the delay clock signal, and a plurality of outputs to provide the secondary side switching control signals having switching transitions corresponding to the transitions of the delay clock signal; and an output control circuit, including an output coupled with the second input of the delay circuit to provide the control output signal to set the phase shift angle according to the output voltage or current signal and a setpoint signal.

12. A control circuit to regulate an output voltage or current signal of an isolated dual active bridge DC to DC converter having first and second bridge circuits and a transformer, the control circuit comprising:

a clock circuit to provide a secondary side clock signal;

a delay circuit, including a first input to receive the secondary side clock signal, a second input to receive a control output signal to set a phase shift angle, and an output to provide a delay clock signal including transitions delayed by the phase shift angle from switching transitions of the secondary side clock signal;

a secondary side driver circuit, including an input coupled with the output of the delay circuit to receive the delay clock signal, and a plurality of outputs to provide secondary side switching control signals having switching transitions corresponding to the transitions of the delay clock signal to operate switches of the second bridge circuit to generate the output voltage or current signal;

an output control circuit, including an output coupled with the second input of the delay circuit to provide the control output signal to set the phase shift angle according to the output voltage or current signal and a setpoint signal;

a clock recovery circuit configured to synchronize the secondary side clock signal to transitions in a sense coil voltage signal of a sense coil of the transformer; and an analog front end circuit, including an input coupled to the sense coil to receive the sense coil voltage signal, a level shifting circuit, a filter circuit, and an output to provide a level shifted voltage signal according to the sense coil voltage signal;

the clock recovery circuit including an input connected to the output of the analog front end circuit to receive the level shifted voltage signal, and an output to provide a recovered clock signal including transitions corresponding to the transitions in the sense coil voltage signal; and the clock circuit including a delay locked loop (DLL) circuit, including: a first input connected to the output of the clock recovery circuit to receive the recovered clock signal; a second input connected to receive the secondary side clock signal; and a DLL output to provide the secondary side clock signal having transitions corresponding to transitions in the recovered clock signal.

13. The control circuit of claim 12, wherein the clock recovery circuit includes:

a sense amplifier, including an input that is AC coupled to the output of the analog front end circuit to receive the level shifted voltage signal, and an output to provide a sense amp output voltage signal; and a deglitch circuit, including an input connected to the output of the sense amplifier to receive the level shifted voltage signal, and an output to provide the recovered clock signal with a transition corresponding to a first rising or falling edge of the sense coil voltage signal according to the level shifted voltage signal.

14. A control circuit to regulate an output voltage or current signal of an isolated dual active bridge DC to DC converter having first and second bridge circuits and a transformer, the control circuit comprising:

a clock circuit to provide a secondary side clock signal;

a delay circuit, including a first input to receive the secondary side clock signal, a second input to receive a control output signal to set a phase shift angle, and an output to provide a delay clock signal including transitions delayed by the phase shift angle from switching transitions of the secondary side clock signal;

a secondary side driver circuit, including an input coupled with the output of the delay circuit to receive the delay clock signal, and a plurality of outputs to provide secondary side switching control signals having switching transitions corresponding to the transitions of the delay clock signal to operate switches of the second bridge circuit to generate the output voltage or current signal, the secondary side driver circuit being configured to control the switching transitions of the secondary side switching control signals to lag the switching transitions of the secondary side clock signal by the phase shift angle in a range between −90 degrees and +90 degrees in each of a plurality of secondary side switching cycles;

an output control circuit, including an output coupled with the second input of the delay circuit to provide the control output signal to set the phase shift angle according to the output voltage or current signal and a setpoint signal; and a sense coil voltage signal of a sense coil of the transformer having a waveform including a first rising edge transitioning from a maximum negative voltage level toward zero volts, a second rising edge extending to a maximum positive voltage level, a first falling edge extending from the maximum positive voltage level toward zero volts, and a second falling edge extending to the maximum negative voltage level; and a clock recovery circuit configured to synchronize the secondary side clock signal to: transitions in the sense coil voltage signal; and the first rising edge of the sense coil voltage signal according to the level shifted voltage signal.

* * * * *